United States Patent [19]
Geannopoulos et al.

[11] Patent Number: 6,075,832
[45] Date of Patent: Jun. 13, 2000

[54] METHOD AND APPARATUS FOR DESKEWING CLOCK SIGNALS

[75] Inventors: George Geannopoulos; Keng L. Wong; Greg F. Taylor, all of Portland; Xia Dai, Beaverton, all of Oreg.

[73] Assignee: Intel Corporation, Santa Clara, Calif.

[21] Appl. No.: 08/946,671

[22] Filed: Oct. 7, 1997

[51] Int. Cl.$^7$ ..................................................... H03D 3/24
[52] U.S. Cl. ........................ 375/375; 375/371; 395/552; 327/152; 327/149
[58] Field of Search .................................... 375/371, 375; 395/552; 327/152, 156, 149, 158

[56] References Cited

U.S. PATENT DOCUMENTS

| | | | |
|---|---|---|---|
| 4,789,996 | 12/1988 | Butcher | 375/376 |
| 5,087,829 | 2/1992 | Ishibashi et al. | 327/152 |
| 5,101,117 | 3/1992 | Johnson et al. | 327/149 |
| 5,398,262 | 3/1995 | Ahuja | 375/356 |
| 5,675,273 | 10/1997 | Masleid | 327/156 |
| 5,819,076 | 10/1998 | Jeddeloh et al. | 395/552 |

OTHER PUBLICATIONS

PCT Search Report for International Application No. PCT/US98/17399, mailed Jan. 27, 1999, 5 pages.

*Primary Examiner*—Stephen Chin
*Assistant Examiner*—Shuwang Liu
*Attorney, Agent, or Firm*—Blakely, Sokoloff, Taylor & Zafman LLP

[57] ABSTRACT

An apparatus for deskewing clock signals in a synchronous digital system. The apparatus contains a phase detection circuit that receives a plurality of clock signals and generates an output based on a phase relationship between those clock signals. A controller then receives the output of the phase detector and determines which one of the plurality of clock signals requires adjustment based on the output of the phase detector and a bit from a delay shift register. The controller transmits a delay signal to one of a plurality of delay circuits which modifies the delay of the clock signal that the controller determined to require adjustment.

21 Claims, 10 Drawing Sheets

METHOD AND APPARATUS FOR DESKEWING CLOCK SIGNALS

CROSS-REFERENCE TO RELATED APPLICATION

This application is related to U.S. patent application Ser. No. 08/947,252 entitled *Adaptive Filtering Scheme For Sampling Phase Relations Of Clock Networks* by inventors Xia Dai and John Thompson Orton, filed on the same date as the present application, and assigned to the same assignee as the present application.

FIELD OF THE INVENTION

The present invention pertains to the field of clock distribution management. More particularly, the present invention relates to digitally deskewing clock distribution lines within a microprocessor.

BACKGROUND OF THE INVENTION

Early microprocessor designs use a single clock distribution line, or spine, located in the center of the microprocessor to distribute a clock signal throughout the microprocessor. Grided power distribution within microprocessors create non-uniform thermal and voltage gradients across the die creating skew in the distributed clock signal. Some microprocessor designs use two clock distribution lines along the periphery of the die to reduce this effect. This method, however, still results in skew between clock distribution lines. As clock frequency in microprocessor designs increases, skew management in the clock distribution network becomes more important. Clock skew affects the microprocessor input/output ("I/O") and internal circuit timing. In maximum delay paths, clock skew limits the maximum operating frequency. In minimum delay paths, clock skew causes the microprocessor to fail at any frequency. Clock skew is a function of load, network distribution, and device mismatch as well as temperature and voltage gradients.

For one prior analog synchronizing system, a center taped fixed delay is used in one distribution line while a second distribution line is adjusted. One disadvantage of this analog approach is that it generates noise in the feedback loop of the system as the delay is increased.

SUMMARY OF THE INVENTION

An apparatus for digitally deskewing clock distribution signals within a microprocessor is described. The digital deskewing circuit is comprised of delay lines in the clock distribution lines, a phase detection circuit, and a controller. The phase detection circuit determines the phase relationship between the clock distribution lines, while adjusting for noise, and generates an output for the controller. The controller takes the phase detection information and a bit from a delay shift register and makes a discrete adjustment to one of the delay lines.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A digital deskewing circuit is described comprised of delay lines in a pre-global microprocessor clock distribution network, phase detection circuitry, and control logic. The control logic receives clock spine phase relation information and adjusts the delay of the delay lines in order to compensate for skews in the clock distribution network. Intended advantages of the embodiments of the present invention include skew reduction based on actual clock network component and interconnect variations. One intended advantage is that skew is reduced while delay in the feedback loop of the clock distribution network is minimized.

Figure 1:
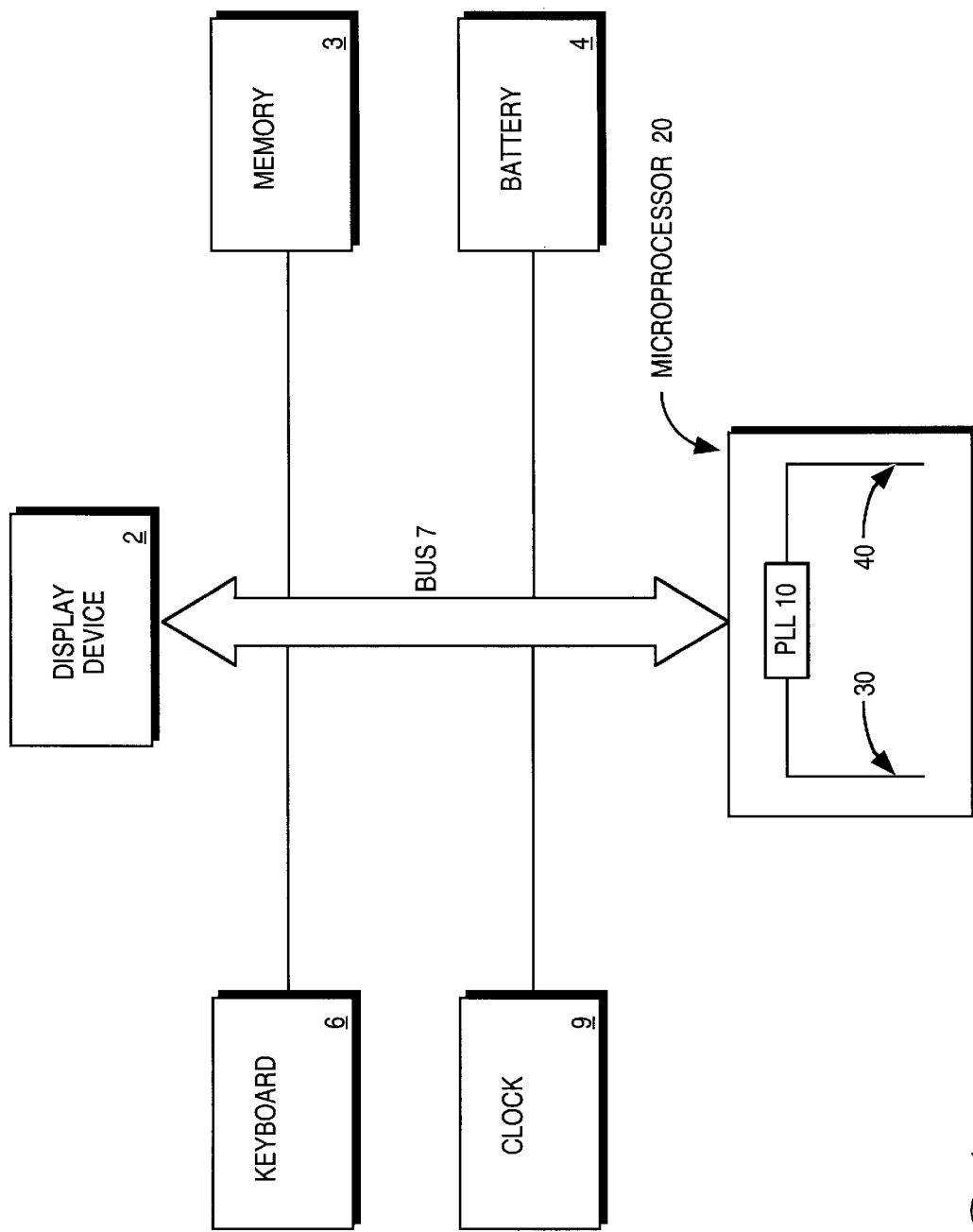
FIG. 1 shows a block diagram of a computer system for one embodiment of the present invention.

FIG. 1 shows an overview of a computer system having a microprocessor containing an embodiment of the present invention. The computer system, for one embodiment, is a battery powered system. For other embodiments, the computer system can be AC ("alternating current") powered. The computer system can be a laptop computer, a notebook computer, a desktop computer, a workstation, a mainframe, or any other type of computer. In addition, computer system can be any other type of data processing or signal processing system such as a printer system or cellular phone system. The computer system generally comprises a display device 2, a keyboard 6, a memory 3, a battery 4, a clock 9, and a microprocessor 20 having two clock spines 30, 40 and a phase lock loop ("PLL") 10. Bus 7 couples together the various components and subsystems. Bus 7 comprises signal lines, clock lines, and power supply lines.

The memory 3 stores information for use by the microprocessor. The memory 3 can comprise a dynamic random access memory ("DRAM"), a static random access memory ("SRAM"), a hard disk drive, a floppy disk drive, a compact disc read only memory device ("CD-ROM"), a flash memory or other memory device.

The battery 4 provides power to the computer system. Typically, computer systems are capable of utilizing AC power however, battery power is used when the use of AC power is not convenient or is unavailable. The battery 4 can be lithium, nickel cadmium, nickel metal hydride, or other battery device. Because of the need to conserve energy in battery powered computer systems, it is typical for such systems to place various components or subsystems, including the microprocessor, in a standby or low power mode when no computing activity is present. In a low power mode parts or all of microprocessor 20 may be turned off and, therefore, one or both clock spines are turned off. Under such conditions, the deskewing circuit will also need to be deactivated. When the system returns to its normal mode, the deskewing circuit will restore to its normal state. Other embodiments of the present invention can be configured to only deskew the clock distribution spines during power-up of the system.

The clock 9 is used to provide a timing reference at which operations occur a synchronized computer system. The clock 9 can be a crystal oscillator, timer, multivibrator, or other timing device. The clock 9 provides timing signals to the computer subsystems, such as the microprocessor, in order to synchronize operations of those subsystems.

The microprocessor 20 receives signals from the keyboard 6 and transmits information to the display device 2. For an alternate embodiment, microprocessor 20 can be a co-processor. For other embodiments microprocessor 20 can be another type of processor, such as a microcontroller. The microprocessor 20 processes information from and stores information in memory 3. The microprocessor 20 is capable of decoding and executing a computer program or an operating system.

For the embodiment described below, the deskewing circuit is implemented with two clock distribution spines, lines 30 and 40, coupled to PLL 10 of microprocessor 20. The present invention can, however, include more than two clock spines or a single segmented clock spine.

Figure 2:
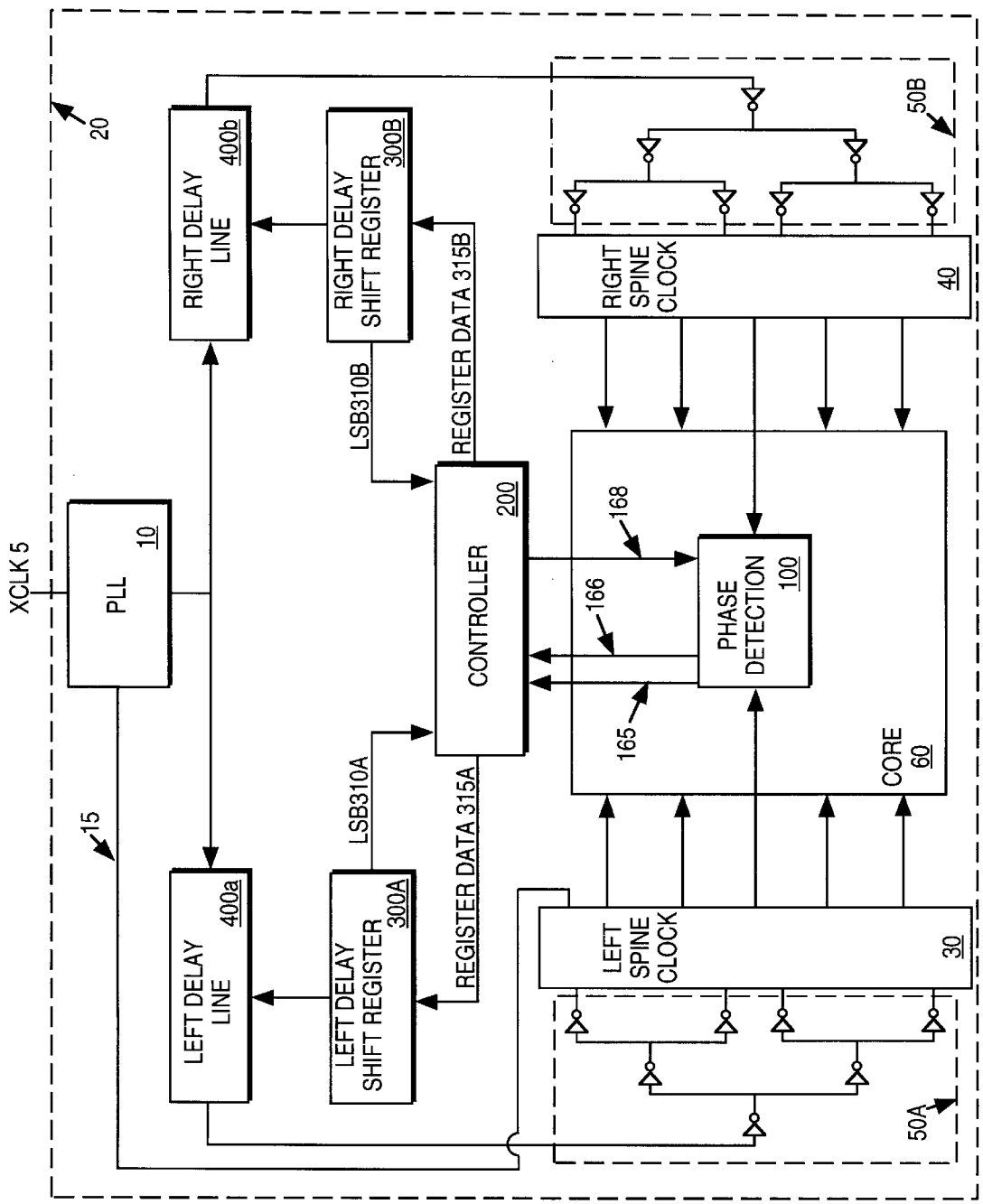
FIG. 2 shows a block diagram of a clock distribution network with clock generation and a digital deskewing circuit.

FIG. 2 sets forth a block diagram of a digital deskewing circuit within the microprocessor 20 that implements one embodiment of the present invention. A PLL 10, within microprocessor 20, operates to lock or synchronize an internal clock to an external clock. Typically, the PLL generated internal clock operates at a higher frequency than the external clock through a well known method called frequency synthesis. For one embodiment, the PLL 10 synchronizes the left clock spine 30 via line 15 with the clock 9 supplied to the PLL via the input XCLK5.

The PLL 10 outputs the synchronized clock signal through delay lines 400a and 400b and buffers distribution 50a and 50b. The buffered distributions 50a and 50b increase the loading or drive capability of the clock network. The clock spines 30 and 40 are clock signal lines that distribute the PLL 10 generated internal clock core 60 of microprocessor 20. The phase detection circuit 100 of FIG. 2 determines the phase relationship between left spine clock 30 and right spine clock 40 and generates a binary output on bus lines 165 and 166 for input to the controller 200. Controller 200 also receives the least significant bit ("LSB") of left delay shift register 300a and right delay shift register 300b along lines LSB 310A and LSB 310B respectively. Using these inputs controller 200 adjusts the capacitive loading found along delay lines 400a and 400b in order to compensate for clock skew. The loading adjustment is performed via outputs register data 315A and register data 315B of controller 200. Register data 315A and register data 315B change the stored values in Left Delay Shift Register 300A and Right Delay Shift Register 300B. The values in these delay shift registers are used to vary the delay on left spine clock 30 and right spine clock 40 via the removal or addition of capacitive loading on Left Delay line 400a and Right Delay line 400b.

For one embodiment, register data 315A shifts a value of "1" into the LSB of Left Delay Register 300A adding capacitive loading to Left Delay Line 400a. This increases the delay on left clock spine 30. Register data 315A shifts a value of "0" into the MSB of Left Delay Register 300A, thus reducing capacitive loading with respect to Left Delay Line 400a. This reduces the delay on left clock spine 30. Register data 315B shifts a value of "1" into the LSB of Right Delay Register 300B to add capacitive loading to Right Delay Line 400b, thus increasing the delay on right clock spine 40. Register data 315B shifts a value of "0" into the MSB of Right Delay Register 300B to reduce capacitive loading with respect to Right Delay Line 400b, thus reducing delay on right clock spine 40.

Figure 3:
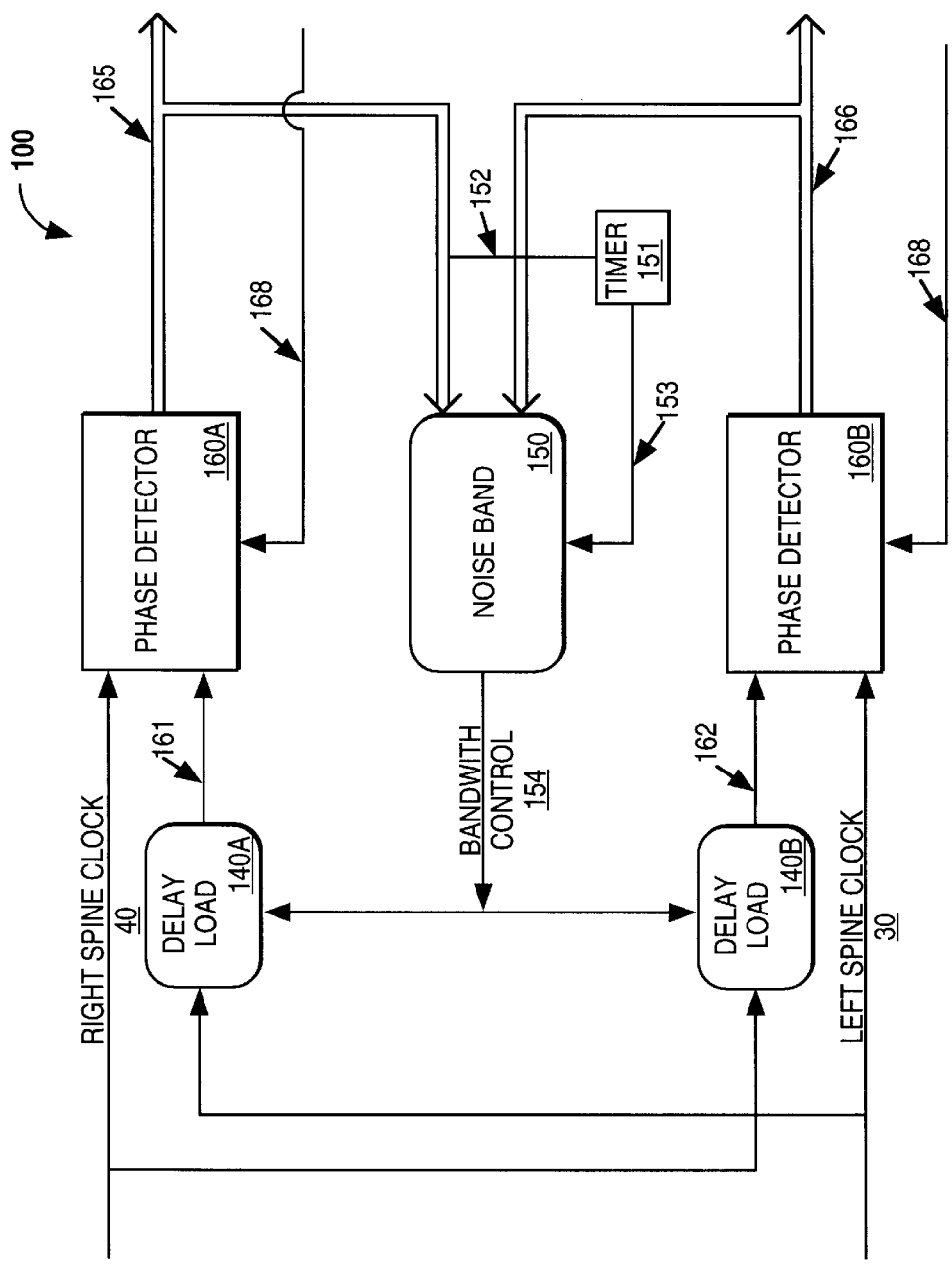
FIG. 3 illustrates a phase detection circuit.

FIG. 3 shows phase detection circuit 100, which is comprised of two symmetric phase detectors 160a and 160b, two delay loads 140a and 140b, and a noise band 150 (see below). Left spine clock 30 and right spine clock 40 of FIG. 2 are inputs to phase detectors 160a and 160b respectively. Phase detectors 160a also has a delayed left spine clock 30, denoted as line 161, as an input. Phase detectors 160b also has a delayed right spine clock 30, denoted as line 162, as an input. Signals on line 161 and 162 are delayed by an adjustable equal amount controlled by delay loads 140a and 140b respectively. In phase detector 160a, the signal from the left spine clock 30 will be delayed by a fixed amount and then compared against the undelayed signal from the right clock spine 40. In phase detector 160b, the signal from the right spine clock 40 will be delayed by a fixed amount and compared against the undelayed clock signal from the left clock spine 30. Each phase detector will determine whether the delayed clock signal is leading the undelayed clock signal.

Figure 4A:
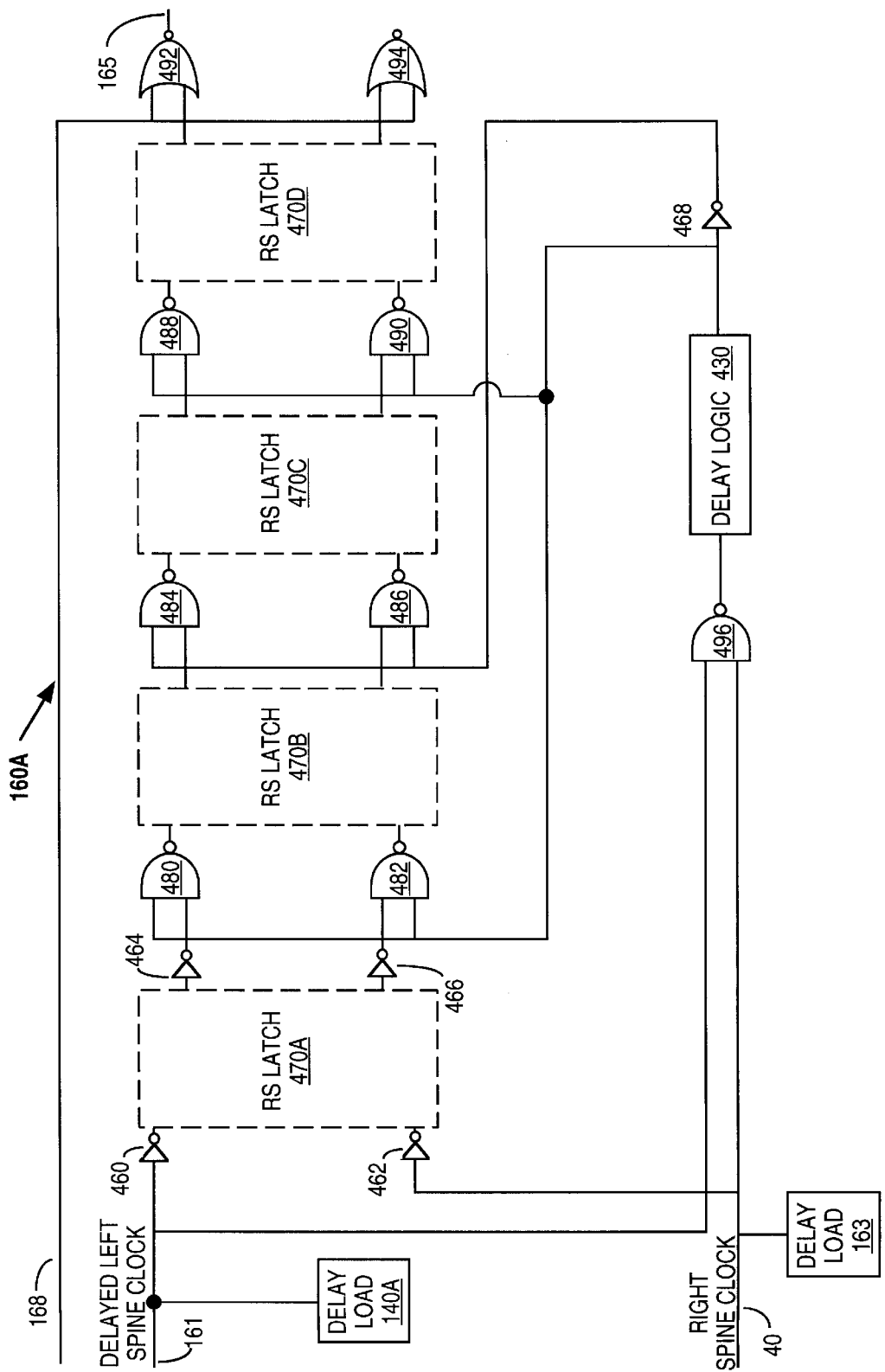
FIG. 4a illustrates a phase detector.

FIG. 4a illustrates phase detector 160a of phase detection circuit 100. The phase detector 160a is made from serial coupling of four RS Latch 470's. Input delayed left spine clock 161 is coupled to delay load 140a, INVERTER 460, and NAND 496. Input right spine clock 40 is coupled to Delay load 163, INVERTER 462, and NAND 496. The output of INVERTERs 460 and 462 are inputs to the first RS Latch 470A. The output of NAND 496 is coupled to Delay Logic 430.

One output of RS Latch 470A is coupled to RS Latch 470B via INVERTERs 464 and NAND 480 while the second output is coupled to the RS Latch 470B via INVERTERS 466 and NAND 482. The input of NAND gates 480 and 482 is the output of Delay Logic 430. Similar coupling connects RS Latch 470B to RS Latch 470C and RS Latch 470C to RS Latch 470D. However, one input of NAND gates 484 and 486 is coupled to the output of INVERTER 468, which in turn is coupled to the output of Delay Logic 430. The output of RS latch 470D and input 168 (see below) are coupled to NOR gate 492. NOR gate 492 generates binary output 165.

For one embodiment of the present invention, delay load 140a is adjustable with seven delay load taps in addition to one fixed tap. The delay load 140a is initially set to the one fixed tap and a delay load 163 is used with no taps set for matching. The delay per tap is nominally set to 15 pico seconds ("ps") but can be varied according to design requirements. Phase detector 160b operates in manner similar to that described for phase detector 160a above.

Figure 4B:
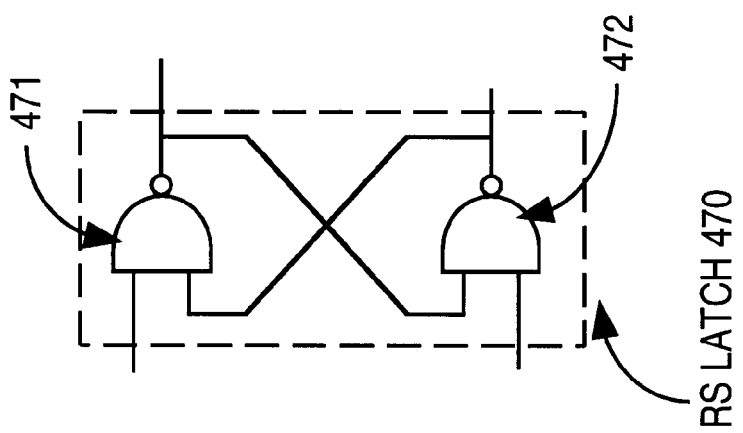
FIG. 4b illustrates cross coupled NAND gates.

FIG. 4b illustrates RS Latch 470 which includes cross coupled NAND gates 471 and 472. Cross coupled NAND gates 471 and 472 are configured as RS (Reset Set) latches. Metastability is a factor affecting latch performance. Metastability occurs when two signals come into a latch at approximately the same time resulting in a latch output between a zero ("0") and a one ("1"), i.e. deviate from full VCC or VSS (ground) levels. Propagation of this condition down the chain of latches could result in a false output state of the phase detector. The latches are designed and pipelined to reduce the probability of a metastability condition propagating when multiple latches are coupled serially.

Prior phase detection schemes use pulse widths that drive analog voltages. Phase detectors 160a and 160b provide a binary output on bus lines 165 and 166 for controller 200. The possible output combinations of signals 165 and 166 reflect the delay between left spine clock 30 and right spine clock 40. For one embodiment, an output value of "10" corresponds to left spine clock 30 leading right spine clock 40. An output value of "01" corresponds to right spine clock 40 leading left spine clock 30. An output value of "00" corresponds to both left spine clock 30 and right spine clock 40 remaining within the bandwidth of the noise band filter 150. The output "11" does not typically occur. The delayed inputs 161 and 162 to the phase detectors 160a and 160b assure that the 11 output state does not occur (output 11 means each delayed input is leading the other, a contradictory condition which typically does not occur unless falsely generated due to the metastability of the cross coupled NAND gates of RS Latch 470).

For another embodiment of the present invention, the microprocessor operates in a low power mode where not all clock spines are used. In such operating modes the deskewing circuit is disabled, the shift register bits are stored, and the output of the phase detection circuit 100 is forced to the 00 state by the controller 200 via line 168 of FIG. 2. This is done in order to reinitialize the deskew circuit to its pre-shut down state upon a return to normal power mode.

Figure 5A:
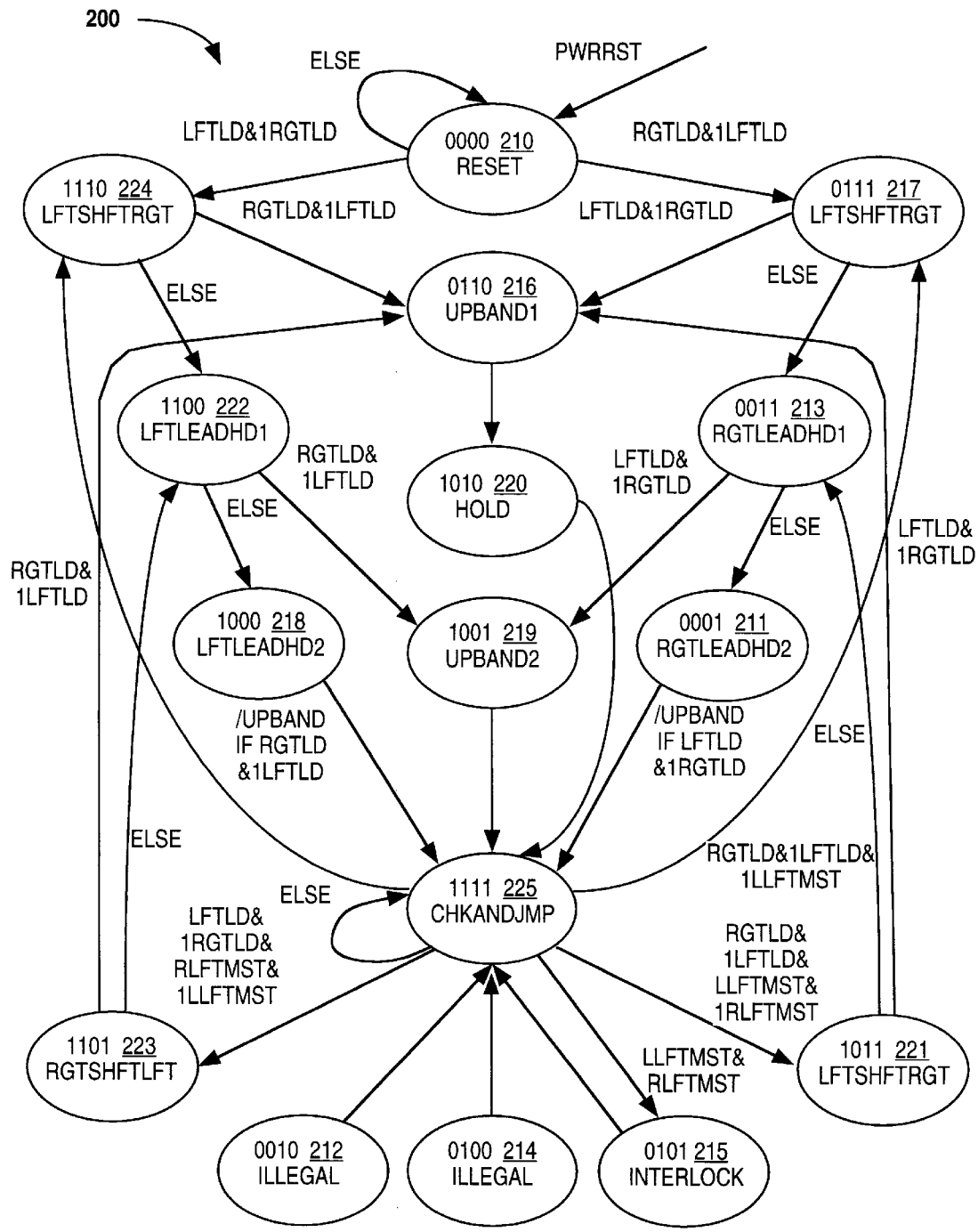
FIG. 5a illustrates a state diagram of a controller.

FIG. 5A shows a state diagram of controller 200. The control of the deskewing circuit is executed by a state machine that interprets the phase detection 100 outputs 165 and 166 along with the delay shift register's least significant bits ("LSB") 310a and 310b and then updates the delay lines 400a and 400b. The latency from sampling the clock spines 30 and 40 to making adjustments to the delay lines 400a and 400b is just over three clock cycles. The new sample is taken in the fifth cycle. Within every four cycles there will only be at maximum one shift event.

Updating begins at the check and jump ("CHKANDJMP") state 225. In state 225, the controller will shift either the left 300a or right delay shift register 300b up or down. The controller determines which delay shift register to shift based on the delay between left clock spine 30 and right clock spine 40 and the values of LSB 310a and LSB 310b. As previously discussed, the phase detection outputs 165 and 166 reflect the delay between left spine clock 30 and right spine clock 40. For example, if the left clock spine 30 is leading the right clock spine 40 and the LSB 310b of right delay shift register 300b is a "0" (indicating no load is currently on the right delay line), then the controller moves to state 224 and shifts the left delay shift register 300a up one bit. Because the controller 200 detected no delay added on right shift register 300b, it proceeded to add delay to the left clock spine 30. Next, if the controller detects an upband event, state 216, it will hold one cycle, state 220, and then return back to the CHKANDJUMP state 225. An upband event occurs when the phase relationship of the clock spines reverses prior to when the modified delay to one of the delay lines takes effect. If the controller had not detected an upband event in state 224, it would proceed to state 222. If no upband event is detected in state 222, it will go to state 218. Otherwise it will go to state 219.

For another example, if the left clock spine 30 is leading the right clock spine 40 and the LSB 310b of the right delay shift register 300b is a "1" (indicating a load is currently on the delay line), then the controller moves to state 223 and shifts a "0" into the MSB of the right shift register 300b and shift a "1" out from the LSB of the right shift register. As in the previous example, the controller will hold the shift register bits, state 222, and monitor for upband events, state 219. The controller states 221, 217, 213 and 211 operate in a manner similar to that described for states 223, 224, 222, and 218, respectively, when the controller 200 detects the right clock spine 40 leading the left clock spine 30.

The illegal blocks 212 and 214 are the states that should not exist under normal conditions when the controller 200 detects an impossible condition, due to metastability, and it loops back into the CHKANDJUMP state 225.

The reset block 210 is the initial state that the controller 200 enters on power-up or power reset ("PWRRST"). In this initial state no delay has yet been added to either shift register 300a or 300b. Therefore, both shift registers 300a and 300b have "0" in all of their bit locations and the controller 200 can only add delay to either shift register 300a or 300b. As such, the only two possible subsequent states are state 224 or state 217 corresponding to left shift register 300a having a "1" shifted right into its left most bit 310a or right shift register 300b having a "1" shifted right into its left most bit, respectively. The controller 200 then proceeds in the manner described above.

For one embodiment of the present invention, the state machine of the controller 200 incorporates interlock to minimize loop delay. Interlock prevents addition of delay to one line when delay exists on the other line. Only if the delay line that was adjusted was driven to no delay in the previous update and the phase detection circuit 100 indicates the need to further reduce this delay will the controller start increasing the delay of the other delay line. To illustrate, in the previous example, if the LSB 310b of right delay shift register 300b had been a "1" (indicating a load currently exists on the delay line), then the right delay shift register 300b is shifted down one bit. Thus, the controller 200 decreases the delay on the right clock spine 40 before it would add delay to the left clock spine 30. State 215 is entered upon a detection of a shift register pattern of having "1"s in both of the LSBs of the delay shift registers. The corruption of delay shift registers might have been caused by metastable events and will be corrected to normal by shifting out 1's from the LSB of both delay shift registers at state 215. Because power supply noise induced jitter is a function of the amount of power supply noise and clock loop delay, the interlock feature assures that the lagging clock spine is kept to a minimum delay in order to minimize the clock jitter.

Figure 5B:
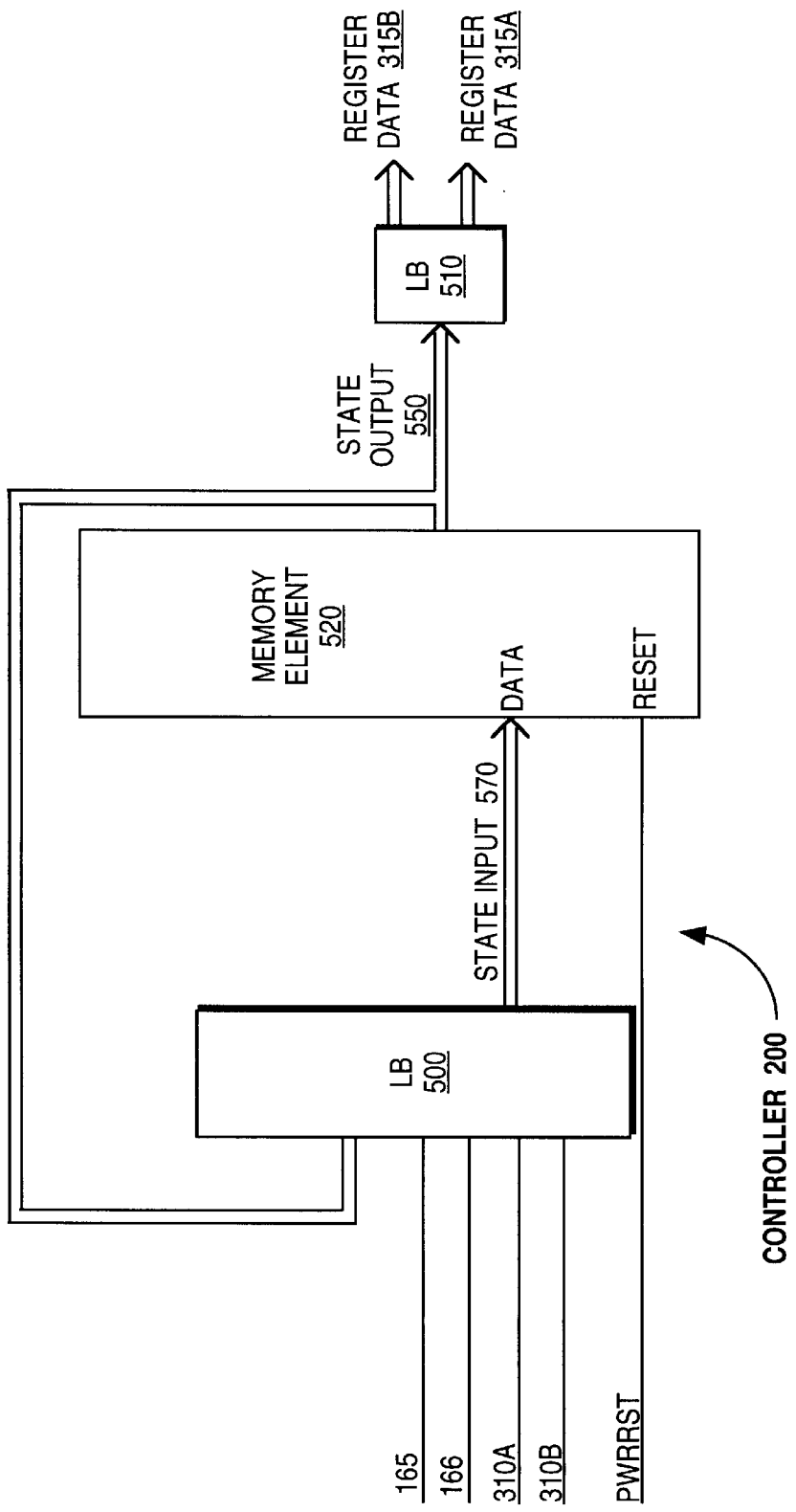
FIG. 5b illustrates a logic block diagram of a controller.

FIG. 5b illustrates a logic diagram for implementing one preferred embodiment of the state diagram found in FIG. 5a. Many variations and implementations of the state diagram found in FIG. 5a are possible. FIG. 5b consists of combinational logic blocks (LB) 500 and 510 coupled to memory element 520 in a feedback path. The binary information stored in memory element 520 defines the state of controller 200 as illustrated in FIG. 5a.

For one embodiment, memory element 520 includes RS flip-flops consisting of cross-coupled inverters. For alternative embodiments, memory element 520 includes, for example, a loadable/resettable counter, D flip-flops, JK flip-flops, or a static look up table.

Controller 200 has inputs 165, 166, PWRRST, 310A, and 310B. Input 165 and 166 are the binary outputs of phase detection circuit 100 of FIG. 3. Inputs 165 and 166 inform controller 200 whether left spine clock 30 is leading; whether right spine clock 40 is leading; or whether both left spine clock 30 and right spine clock 40 are within the bandwidth of noise band filter 150 of FIG. 3. Input PWRRST informs controller 200 of a power-up or a power reset. Inputs 310A and 310B represent the LSB of left delay shift register 300A and right delay shift register 300b respectively. These inputs together with the present state of memory element 520 determine the binary output of controller 200. The binary outputs of controller 200 are register data 315a and register data 315b. Output register data 315a changes the value in left delay shift register 300a, which in turn varies the clock delay on left clock spine 30. Output register data 315A is used to shift a value of "1" into the LSB of left delay shift register 300a to increase delay or a value of "0" into the MSB of left delay shift register 300a to reduce delay. Output register data 315B changes the value in right delay shift register 300b, which in turn varies the clock delay on right clock spine 40. Output register data 315B is used to shift a value of "1" into the LSB of right delay shift register 300b to increase delay or a value of "0" into the MSB of right delay shift register 300b to reduce delay.

Accordingly, by varying the outputs register data 315a and register data 315b, following the state diagram of FIG. 5a, controller 200 can make discreet adjustment to either right clock spine 40 or left clock spine 30. The clock adjustment is dependent on the outputs of phase detector circuit 100 and the LSBs of left delay shift register 300a and right delay shift register 300b.

The state inputs of FIG. 5a are stored in memory element 520. Memory element 520 includes a reset input coupled to input PWRRST; a four bit data input coupled to LB 500 via state input 570; and a four bit data output, state output 550.

The reset input, when asserted, changes the output of state output 550 to a "0000" corresponding to state 210 of FIG. 5a. The reset input is asserted via input PWRRST.

LB 500 changes the present state of memory element 520. In particular, to change the present state, LB 500 loads a four bit value into memory element 520 via input state input 570. To determine a loading value, LB 500 samples inputs 165 and 166; state output 550; and inputs LSB 310A and LSB 310B. Depending on these inputs, LB 500 follows the state transitions of state diagram FIG. 5a. These state transitions fall into the following four categories: upband events, illegal states, interlock, and normal operation.

An upband event occurs when the phase relations of clock spines reverses prior to when a delay of one of the clock lines takes effect. During such an event LB 500 determines if state output 550 is a "0111" or a "1110" in which case LB 500 holds for one cycle and loads in a value of "1111" into memory element 520. If state output 550 is a "1100" or a "0011," LB 500 loads in a value of "1111" into memory element 520 without a delay. This shift in states corresponds to states 213, 216, 217, 219, 220, 222 and 224 of FIG. 5a.

Illegal states occur due to abnormal conditions, such as metastability. These states create a value of "0010" and "0100" on state output 550. When these states occur LB 500 loads in a value of "1111" into memory element 520.

LB 500 also handles interlock, state output "0101." Interlock prevents addition of delay to a clock line when delay exists on another clock line. In particular, controller 200 (through LB 500) ensures that output signals register data 135b and register data 315a follow interlock. Accordingly, if possible, these outputs compensate for clock skew by reducing delay from an opposite clock line as opposed to simply adding delay to a given clock line. This shift in states corresponds to states 212, 214, and 215 of FIG. 5a.

Normal operation includes all state transitions of FIG. 5a, except for the aforementioned. During normal operation, LB 500 loads in the next state of controller 200 depending on the present state of state output 550. LB 500 can load in one of the following values: a "1101", a "1110", a "1100", a "1000", a "1011", a "0111", a "0011", a "0001", and a "1111" into memory element 520. This shift in states corresponds to states 211, 213, 217, 218, 221, 222, 223, 224 or 225 of FIG. 5A.

LB 510 has input state output 550 and outputs register data 315a and 315b. Output register data 315a determines whether controller 200 should shift a value of "1" into the LSB of left delay shift register 300a or a value of "0" into the MSB of left delay shift register 300a. Output register data 315b determines whether controller 200 should shift a value of "1" into the LSB of right delay shift register 300b or a value of "0" into the MSB of right delay shift register 300b. State output 550 having a value of "1101", "1000", "1011", or "0001" determines whether LB 520 should assert a register shift via signal lines register data 315a or 315b. This shift in states corresponds to states 211, 218, and 223 of FIG. 5a.

Figure 6:
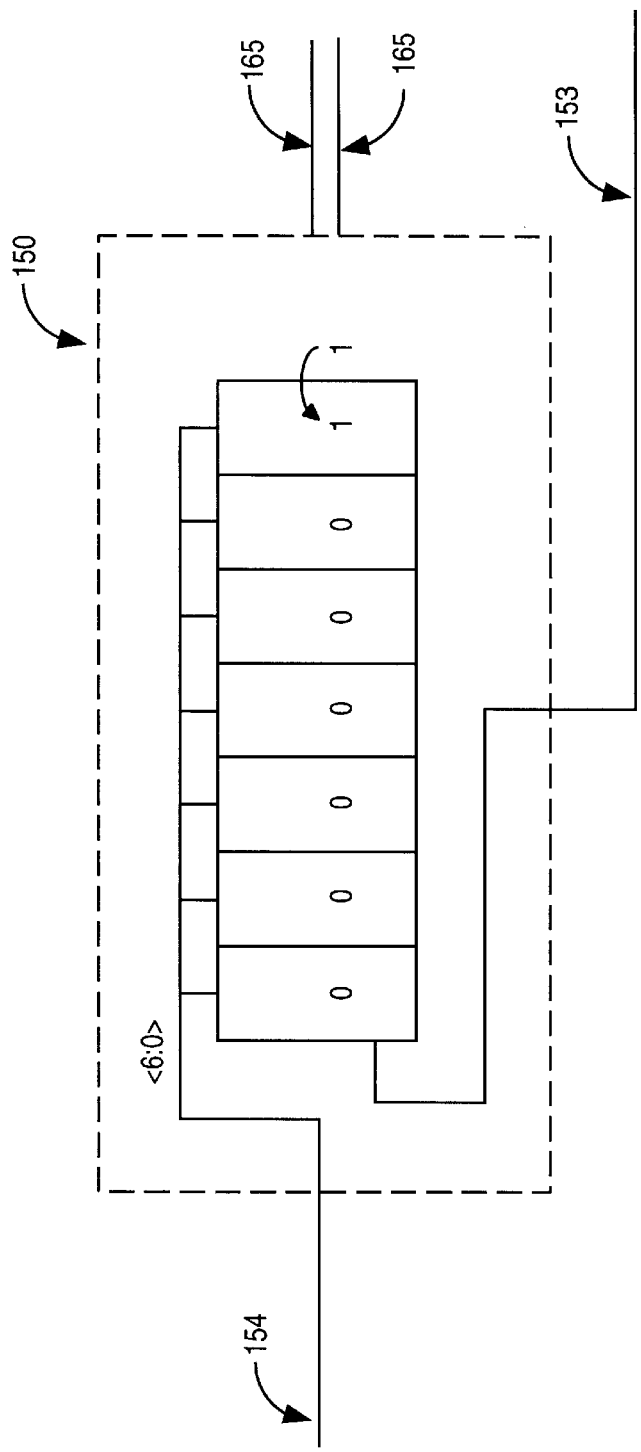
FIG. 6 illustrates a noise band shift register.

For another embodiment of the present invention, a noise band 150 of FIG. 3 is used for filtering out high frequency AC voltage noise. This stabilizes the system and avoids making corrections that could add phase error to the clock spines 30 and 40. The noise band 150 is a seven bit shift register adjustable in steps via bus lines 165 and 166 to control the bandwidth. The noise band filter 150 first starts with minimum bandwidth (all shift register bits "0"). If the phase relationship between the left spine clock 30 and right spine clock 40 reverses before correction takes effect then an upband event will occur. The noise bandwidth will be incremented by shifting a "1" into the register, as shown in FIG. 6, and a delay load tap from delay loads 140a and 140b will be added to phase detector inputs 161 and 162. For example, if during a cycle, the left spine 30 leads the right spine 40, a step delay is introduced into the clock network to delay the left spine 30. But, if before the delay takes effect, the phase detectors 160a and 160b detect that the right spine 40 leads the left spine 30, an upband event will occur indicating that noise resides in the clock network which is faster than the system can follow and with a magnitude greater that the current noise bandwidth. Under such conditions, the delay of the clock spines is not adjusted and the bandwidth of the noise filter 150 is increased via bus lines 165 and 166. This noise filtering scheme reduces latency compared against a digital signal processing ("DSP") scheme which allows the system to correct for slower AC components of skew variation in the clock distribution network due to voltage transients.

The larger the noise band width, however, the larger the skew will be. For one embodiment, the present invention has an analog timer 151 of FIG. 3 that times out at around 10 microseconds ("us") in order to eliminate over conservative noise band width. When the timer times out, if no upband event occurs, the noise band shift register will be decremented by one via line 153 and the corresponding noise band delays 140a and 140b will be reduced by one delay tap. However, if an upband event does occur, the signal sent from the controller to the noise band is used to reset the timer via line 152.

Figure 7:
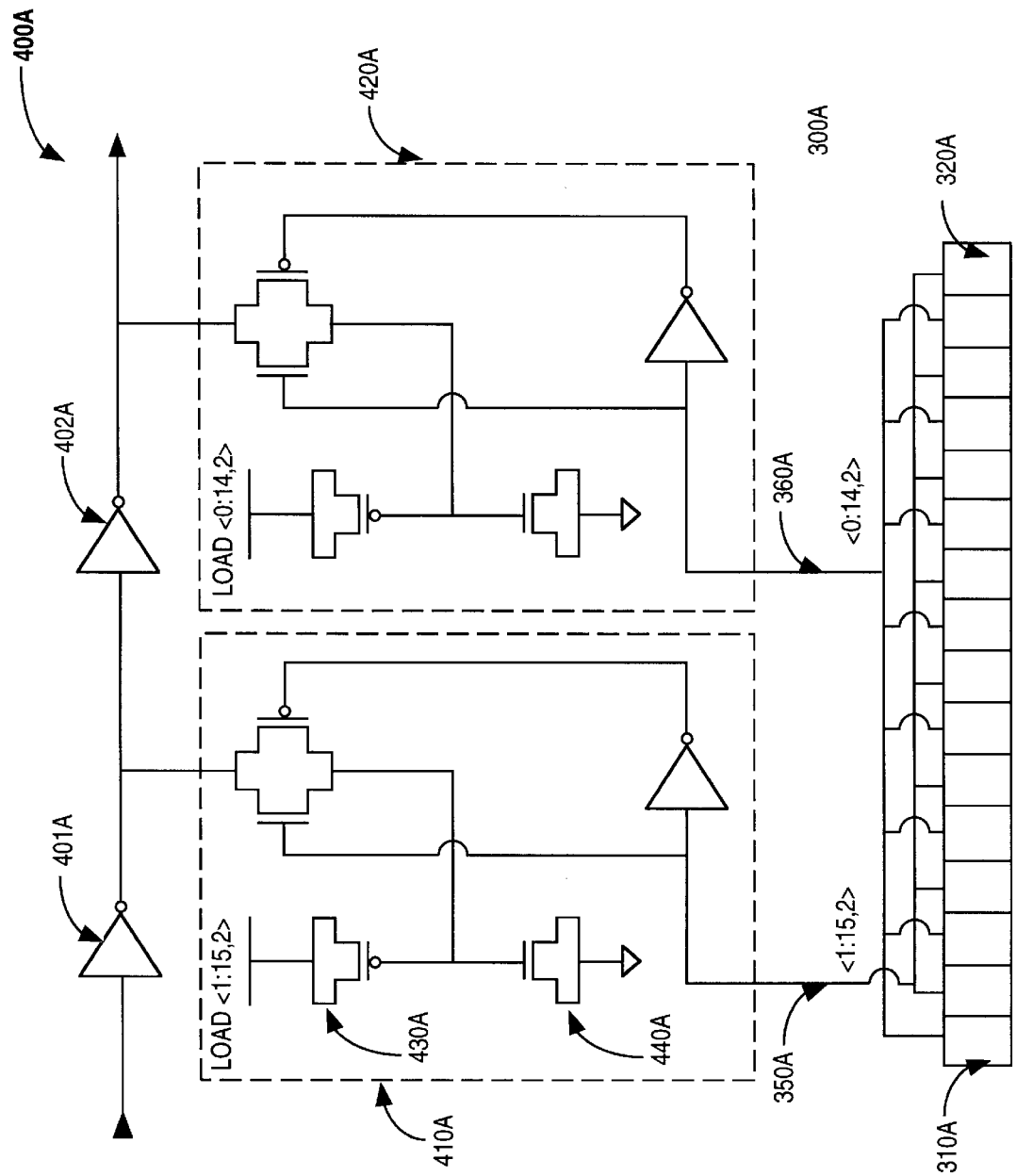
FIG. 7 illustrates a delay line and a delay shift register.

FIG. 7 illustrates the left delay line 400a and the left shift register 300a. For one embodiment of the present invention, the digital delay line is implemented with two INVERTERs 401A and 402A in series, each having a bank of eight capacitive loads 410a and 420a connected to the inverters' outputs through pass gate switches. The addition or removal of the capacitive loads is controlled by delay shift register 300a opening or closing the pass gate switches. The use of two inverters allows the load to be split between two drivers and also provides a non-inverting delay. Both NMOS 440 and PMOS 430 loads are used in each of the capacitive loads in order to reduce voltage sensivity of the capacitance and balance the rising and falling edge delay of the inverters 401*a* and 402*a*.

The delay shift register 300*a* comprises 16 bits (0 to 15) which allows for 17 discrete monotonic steps of delay (16 delay increments plus no delay). The delay per step is nominally set to 15 ps but can be increased or decreased according to design requirements. Each of the 16 bits alternately corresponding to one of the 16 capacitive loads. In this manner, the capacitive loads are alternately added to or removed from the two INVERTER 401*a*, 402*a* outputs. Bits 0 to 14 alternating by two 360*a*, correspond to the eight capacitive loads in bank 420*a* and bits 1 to 15, alternating by two 350*a*, correspond to the eight capacitive loads in bank 410*a*. Each time the controller 200 signals for an adjustment in the delay, either a "1" is shifted into the LSB 310*a* or a "0" is shifted into the most significant bit ("MSB") 320*a* corresponding to increased delay and decreased delay, respectively. This, in turn, switches one of the capacitive loads in the capacitive load banks 410*a* and 420*a* on or off, respectively.

Figure 8A:
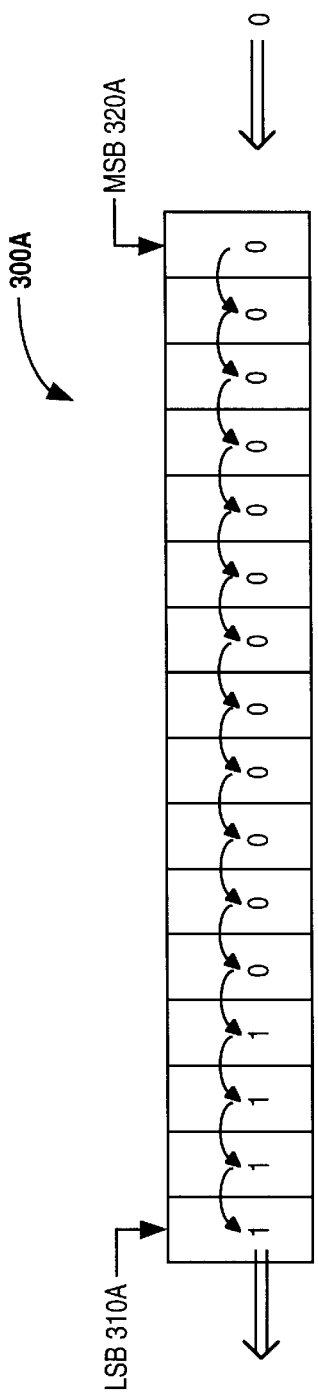
FIG. 8A illustrates a delay shift register with a four bit delay.
Figure 8B:
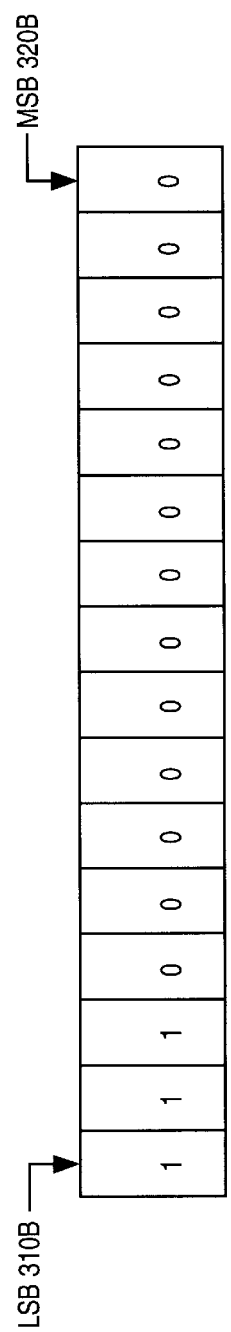
FIG. 8B illustrates a delay shift register with a three bit delay.

For example, FIG. 8A shows the current state of shift register 300*a* programmed with a 4 bit delay indicated by a "1" in each of the first four bits beginning with LSB 310*a*. If controller 200 determines that the right spine clock 40 is leading left clock spine 30 and left delay shift register 300*a* contains a "1" in LSB 310*a*, then the controller 200 will shift a "0" into MSB 320*a* resulting in a shift register state shown in FIG. 8B.

Delay line 400*b* and delay shift register 300*b* shown in FIG. 2 operate in a similar manner to that described for delay line 400*a* and delay shift register 300*a* above.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for deskewing clock signals in a synchronous digital system, comprising:
    a phase detection circuit to receive a plurality of clock signals and generate an output based on a phase relationship between the plurality of clock signals;
    a plurality of delay circuits, each delay circuit coupled to a corresponding one of the plurality of clock signals to adjust the one of the plurality of clock signals based on a delay signal; and
    a controller coupled to the phase detection circuit and the plurality of delay circuits, the controller to receive the output of the phase detection circuit and generate the delay signal, the controller to transmit the delay signal to one of the plurality of delay circuits based on the output of the phase detection circuit.

2. The apparatus of claim 1, wherein the phase detection circuit comprises:
    a first delay block to delay a first clock signal by a pre-determined amount;
    a second delay block to delay a second clock signal by the pre-determined amount;
    a first phase detector to receive one of the delayed clock signals and one of the undelayed clock signals; and
    a second phase detector to receive the other of the delayed clock signals and the other of the undelayed clock signals, the phase detectors configured to compare the delayed and undelayed clock signals and generate an output.

3. The apparatus of claim 2, wherein the output of the phase detectors has three states, wherein the first output state indicates that the first clock signal leads the second clock signal, wherein the second output state indicates that the second clock signal leads the first clock signal, and wherein the third output state indicates that the first and second clock signals are synchronous.

4. The apparatus of claim 3, wherein the first output state is a binary 10, the second output state is a binary 01, and the third output state is a binary 00.

5. The apparatus of claim 4, wherein the first and second delay blocks prevent a binary 11 output state.

6. The apparatus of claim 2, wherein the phase detectors comprise cross coupled logic gates configured as latches.

7. The apparatus of claim 1, wherein the each of the plurality of delay circuits comprise:
    a delay line having two inverters coupled in series and a plurality of capacitive loads selectively coupled to outputs of the two inverters; and
    a delay shift register to receive the delay signal from the controller, the delay shift register to couple or decouple the plurality of capacitive loads based on the delay signal.

8. The apparatus of claim 7, wherein all of the plurality of capacitive loads are decoupled from any one delay line containing capacitive loads before a different delay line inverter output is coupled to the capacitive load.

9. The apparatus of claim 7, wherein the controller comprises means for adjusting the delay shift registers based on the output of the phase detection circuit and a current state of the delay shift registers.

10. The apparatus of claim 1, wherein the controller prevents addition of delay to one of the plurality of clock signals when delay exists on another of the plurality of clock signals.

11. The apparatus of claim 7, wherein one of the plurality of clock signals is disabled, wherein the controller maintains a current state of the delay shift register of the plurality of delay circuits, and wherein the controller drives the output of the phase detection circuit to a predetermined state.

12. A synchronous digital system comprising:
    a clock having a frequency; and
    a processor comprising:
        a generator to receive the frequency of the system clock and generate a plurality of clock signals whose fraction synchronize with the system clock;
        a phase detection circuit to receive the plurality of clock signals and generate an output based on the phase relationship of the plurality of clock signals;
        a plurality of delay circuits, each delay circuit coupled to a corresponding one of the plurality of clock signals to adjust the one of the plurality of clock signals based on a delay signal; and
        a controller configured to receive the output of the phase detection circuit and generate the delay signal, the controller to transmit the delay signal to one of the plurality of delay circuits based on the output of the phase detection circuit.

13. An apparatus configured to deskew clock signals, the apparatus comprising:
    a phase detection circuit to receive a plurality of clock signals and generate data based on a phase relationship between the clock signals;

a plurality of registers, each register coupled to a plurality of delay circuits, each delay circuit coupled to a corresponding one of the plurality of clock signals, wherein the delay circuit adjusts the delay on one of the plurality of clock signals based on a value stored in the register; and a controller coupled to the phase detection circuit and the plurality of registers, the controller reading the data from the phase detection circuit to determine a delay between the plurality of clock signals, wherein the controller selectively adjusts the delay between the plurality of clock signals using one of the plurality of registers.

14. The apparatus of claim 13 further configured to deskew clock signals in a digital system having a low power mode, wherein the phase detection data is stored and the controller inserts a predetermined delay on the plurality of clock lines during the low power mode.

15. The apparatus of claim 14, wherein the controller restores the delay to the plurality of clock signals using the stored phase detection data during a transition from the low power mode to a normal operation mode of the digital system.

16. The apparatus of claim 13, wherein an output of a register is coupled to the controller, the controller to selectively adjust the delay on one of the plurality of clock signals using the data from the phase detection circuit and the output of the register.

17. The apparatus of claim 16, wherein the output of the register comprises a single bit value stored in the register.

18. The apparatus of claim 16, wherein the delay circuit adjusts a delay on a clock line by adding or subtracting a capacitive load.

19. A method of deskewing a digital system, comprising:

determining a phase relationship between a plurality of clock signals, each of the plurality of clock signals coupled to a delay circuit, the delay circuit having an output;

adjusting at least one of the plurality of clock signals based on the phase relationship and the output of the delay circuit to synchronize the plurality of clock signals;

applying the phase relationship to a controller, the controller determining which of the plurality of clock signals requires adjustment based on the phase relationship and the output of the delay circuit;

transmitting a controller signal to the delay circuit of one of the plurality of clock signals determined by the controller to require adjustment, the delay circuit coupled to and affecting the delay of one of the plurality of clock signals; and modifying the delay of one of the plurality of clock signals based on the controller signal.

20. The method of claim 19, wherein determining the phase relationship comprises:

applying a first clock signal to a first phase detector;

delaying a second clock signal by a pre-determined amount;

applying the second clock to the first phase detector;

applying the second clock signal to a second phase detector;

delaying the first clock signal by the pre-determined amount; and applying the first clock signal to the second phase detector, the first and second phase detectors generating the phase relationship corresponding to the first clock signal leading the second clock signal, the second clock signal leading the first clock signal, and the first and second clock signals being synchronous.

21. The method of claim 20, wherein modifying the delay comprises decreasing the delay of the plurality of clock signals to no delay before increasing the delay of the plurality of clock signals.

* * * * *